United States Patent [19]

Ting

[11] Patent Number: 4,931,670
[45] Date of Patent: Jun. 5, 1990

[54] TTL AND CMOS LOGIC COMPATIBLE GAAS LOGIC FAMILY

[75] Inventor: Tah-Kang J. Ting, Emmaus, Pa.

[73] Assignee: American Telephone and Telegraph Company, New York, N.Y.

[21] Appl. No.: 284,215

[22] Filed: Dec. 14, 1988

[51] Int. Cl.[5] .......................................... H03K 19/017
[52] U.S. Cl. .................................. 307/448; 307/450; 307/475
[58] Field of Search ................. 307/443, 448, 450–451, 307/475, 296.1

[56] References Cited

U.S. PATENT DOCUMENTS

| | | | |
|---|---|---|---|
| 4,400,636 | 8/1983 | Andrade | 307/443 |
| 4,404,480 | 9/1983 | Ransom et al. | 307/475 |
| 4,408,136 | 10/1983 | Kirsch | 307/475 |
| 4,590,393 | 5/1986 | Ransom et al. | 307/448 |
| 4,639,621 | 1/1987 | Ikawa et al. | 307/450 |
| 4,644,189 | 2/1987 | Gabillard | 307/450 |
| 4,713,559 | 12/1987 | Vu et al. | 307/450 |
| 4,724,342 | 2/1988 | Sato et al. | 307/450 |
| 4,725,743 | 2/1988 | Anderson | 307/450 |
| 4,771,189 | 9/1988 | Noufer | 307/443 X |
| 4,798,979 | 1/1989 | Lee et al. | 307/443 X |
| 4,844,563 | 7/1989 | MacMillan et al. | 307/448 X |

OTHER PUBLICATIONS

"Noise-Margin Limitations on Gallium-Arsenide VLSI", Stephen I. Long, Senior Member IEEE, and Mani Sundaram, IEEE Journal of Solid-State Circuits, vol. 23, No. 4, Aug. 1988, pp. 893–900.

"GaAs Devices and Circuits", Michael Shur, University of Minnesota, Plenum Press, New York and London, 1987, pp. 431–448.

"Gallium Arsenide Technology", David K. Ferry, Editor-in-Chief, Howard W. Sams & Co., Inc., First Edition, 1985, pp. 119–125, pp. 331–341.

*Primary Examiner*—David Hudspeth
*Attorney, Agent, or Firm*—Scott W. McLellan

[57] ABSTRACT

A novel logic gate, using Gallium-Arsenide technology, that is compatible with TTL or CMOS logic. This logic gate operates off a single voltage supply (e.g. 5 volts) and implements complex logic functions within a single logic gate, such as "AND-OR-INVERT". This is accomplished by having at least one FET with the gate terminal coupling to a current limiter, a first source/-drain terminal coupling to the input of a logic sub-circuit, such as a DCFL circuit, and a second source/drain terminal coupling to the input of the logic gate. A diode disposed between the first source/drain terminal and the input to the logic sub-circuit sets the switching voltage of the logic gate. Parallel-connected FETs performs the logical "AND" sub-function while the logic sub-circuit performs the logical "OR" and "INVERT" sub-functions. Also disclosed is a buffer circuit for driving large loads while providing large output voltage swings.

13 Claims, 4 Drawing Sheets

TTL AND CMOS LOGIC COMPATIBLE GAAS LOGIC FAMILY

FIELD OF THE INVENTION

This invention relates to logic circuits generally, and more specifically, to logic circuits implemented in integrated form using metal-semiconductor field-effect transistors or heterojunction field-effect transistors.

BACKGROUND OF THE INVENTION

Virtually all logic circuits using metal-semiconductor field-effect transistors (MESFETs) or heterojunction field-effect transistors (HFETs), referred to herein as simply FETs, operate at relatively low power supply voltages to minimize power dissipation. For FET logic circuits constructed using Gallium Arsenide (GaAs) technology, the power supply voltage is typically two volts. This choice of supply voltage results from the logic signal inputs to the logic circuits having a limited voltage range, or swing, due to input voltage clamping by the FETs, as will be demonstrated below. It is understood that the input voltage clamping by the FETs is an inherent result of the structure of the FETs themselves; a Schottky barrier is formed at the junction of the gate and channel portion (disposed between the source and drain) of the FET, allowing current to flow into the gate should the gate voltage exceed the Schottky barrier height, an exemplary 0.7 volts for "enhancement" type FETs and 1.5 volts for "depletion" type FETs. The terminology of "enhancement" and "depletion" FETs refers to the operation of the FET at zero gate-to-source voltage: an "enhancement" type FET is off (substantially no current flowing from source to drain) with zero bias and a "depletion" type FET is on (near maximum current flow between source and drain) at zero bias. It is understood that logic circuits utilizing insulated-gate FETs do not suffer from input voltage clamping of the type discussed here. However, insulated gate FETs, such as metal-oxide-semiconductor FETs available in silicon technology, are not readily manufacturable in GaAs technology. A detailed description of the electrical characteristics of MESFETs in logic circuits and selectively doped HFETs are discussed in "Gallium Arsenide Technology," edited by D. K. Ferry, 1985, pp. 331-341 and 119-125, respectively.

It is noted that the terminology logical "zero" and logical "one" are used to denote the logical state of signals, usually defined as being below and above a predetermined voltage, respectively. The predetermined voltage is typically referred to as the switching voltage of the logic circuits used: the switching voltage is the input voltage to the logic circuit at which the output thereof changes logic state. Further, the designation $V_{SS}$ and $V_{DD}$ are used to identify a power source as well as the voltage supplied by the power source and will be used interchangeably.

One consequence of using low power supply voltages for logic circuits is the limited difference in output voltage of the logic circuits between a logical "one" output or a logical "zero" output and the switching voltage of subsequent logic circuits, commonly known as the logical "one" and logical "zero" noise margins, respectively. The smaller either of the noise margins become, the greater the likelihood of electrical noise changing the logic state of a signal. This problem is compounded in integrated circuits where many hundreds, or thousands, of logic circuits are changing state, generating the electrical noise in close proximity to one another. Still further, as will be discussed in greater detail below, the reduced power supply voltage restricts the logic functions which can be performed by the logic circuit to be the inclusive "OR" or "NOR" function.

As stated above, the logic input voltage range is set by the FETs coupling to the logic inputs of the logic circuit, clamping the input voltage to typically one or two times the Schottky barrier height voltage. Referring to FIG. 4, the logic circuit 400 shown is known in the art as direct-coupled FET logic, or DCFL. With the FETs 401, 402 as shown, the logic input IN has a voltage range of essentially $V_{SS}$ (typically 0 volts or ground) plus the on voltage of FET 401 from a preceding logic circuit (as will be explained in more detail below), an exemplary 0.1 volts, to the barrier height voltage of the enhancement type FET 401, an exemplary 0.7 volts. Beyond 0.7 volts, the current into the gate of FET 401 becomes excessive. The switching voltage is slightly above the threshold voltage of FET 401 which, for purposes here, makes the switching voltage an exemplary 0.25 volts. As stated above, the logic voltage range, or swing, for a DCFL circuit 400 is essentially 0.1 to 0.7 volts. This makes the noise margin for a logical "zero" to be 0.25-0.1 volts, or 150 mV, whereas for a logical "one", the noise margin is 0.7-0.25 volts, or 450 mV. Depletion type FET 402 acts as a passive load for FET 401, pulling up the output OUT to $V_{DD}$, typically two volts, when FET 401 is off, and no load is coupled to the output OUT. Hence the output voltage of the circuit 400 can range from $V_{DD}$ to 0.1 volts whereas the input to the logic circuit 400 limits the voltage swing independently of the power supply voltage $V_{DD}$. Therefore the voltage $V_{DD}$ is limited to as low a voltage as practical to reduce the power dissipation of the DCFL circuit 400.

Although not shown here, logical functions, such as the inclusive "OR" function, can be provided by having another FET in parallel with the FET 401 except for the gate terminal. However, to provide a logical "AND" function within the logic circuit 400 alone, i.e., not by using multiple logic circuits 400 to synthesize the logical "AND" function using De Morgan's theorem, another FET (not shown) must be disposed in series between FET 401 and the output OUT. The resulting circuit would require both FETs to be on for the output to change. For both FETs to be on, a logical "one" must be applied to the gates of both FETs. This is not practical, however, since the logical "one" voltage for one FET will be different than for the other FET since they are in series, i.e., the logical "one" for FET 401 is limited to 0.7 volts while the logical "one" voltage for the other FET is 0.7 volts above the drain-to-source voltage of FET 401 when it is on, here 0.8 volts. Therefore, the noise margin for the logic signal to the other FET will be less than the noise margin for the logic signal to FET 401 if the logic swing is limited to 0.7 volts by another logic circuit 400. In addition, the logical "zero" output voltage of the logic circuit having a logical "AND" capability is increased with each FET in series with FET 401, reducing the noise margin for logical "zero". Using the above exemplary FET on voltages and switching voltage, the noise margin is 0.25 volts less the on voltages of the two FETs in series, resulting in a noise margin of 50 mV, instead of the 150 mV as before. Given the present manufacturing capability of FETs in GaAs, a wide variation in the threshold voltage of FET 401 can occur across the wafer, as well as within a single chip, resulting in the switching voltage of the logic circuit 400 being so varied that the logical "zero" noise margin can effectively go to zero. Hence, reliable complex logic networks using multiple DCFL logic circuits is difficult, if not impossible, to achieve in practice when there is electrical noise present.

To overcome these limitations, another logic family, called source-follower field-effect logic (SFFL), was invented by A. I. Faris and P. J. Robertson and disclosed in a patent application filed 23 August 1988, serial No. 07/235,862, and assigned to the same assignee as this invention. An exemplary embodiment thereof is shown in FIG. 5. As shown, FETs 501 and 502 correspond to FETs 401, 402 in FIG. 4. However, the FETs 503–505 form the input stage to the logic circuit 500 and complex logic functions, such as inclusive "OR", are performed by parallel-connecting multiple FETs 503, similar to that done with FET 401 in FIG. 4. Here the switching voltage is an exemplary 1 volt and the maximum input voltage is two times the barrier height voltage (FETs 501 and 503), or an exemplary 1.4 volts, yielding a considerably larger noise margin for the logical "zero" logic level. As in the DCFL circuit 400 (FIG. 4), the output voltage swing can be from $V_{DD}$ to approximately 0.1 volts. Still the output voltage swings are limited by the input of the logic circuit 500 to the exemplary 1.4 volts. Hence, the voltage $V_{DD}$ is reduced to minimize power dissipation as in the case for DCFL. A typical voltage for $V_{DD}$ is 2 volts.

As given above, neither logic circuit types, DCFL (FIG. 4) or SFFL (FIG. 5), have power supply voltages and switching voltages that are compatible with popular logic types commonly used throughout industry, e.g., transistor-transistor logic (TTL) or complementary-metal-oxide-semiconductor logic (CMOS). TTL has a worst-case switching voltage of approximately 1.4 volts and operates from a substantially 5 volt power supply. CMOS logic can, in some cases, operate from 3 volts to 15 volts, and have a switching voltage of approximately one-half the power supply voltage. Typically CMOS logic circuits operate at 5 volts resulting in a switching voltage of approximately 2.5 volts. For the DCFL or SFFL circuits to operate in combination with TTL or CMOS, special voltage translators are required, which slows down the performance of the DCFL or SFFL and dissipates power. Further, at least two power supplies are required: 5 volts for the TTL or CMOS logic and 2 volts for the SFFL or DCFL.

SUMMARY OF THE INVENTION

One feature of this invention is to provide a novel logic gate having relatively low power dissipation at relatively high power supply voltages and to provide for logical "AND" functions without compromising the switching voltage and noise margins of the logic gate.

Another feature is to provide a logic gate voltage using Gallium Arsenide integrated circuit technology (or any III-V or II-VI compound semiconductor integrated circuit technology) which is TTL and CMOS logic gate compatible. Still another aspect is to provide a buffer circuit with relatively wide output voltage swings for increasing the noise margins.

These and other aspects are obtained generally by a logic gate with at least one input and a predetermined switching voltage and a logic sub-circuit with at least one clamped-type input, disposed in an integrated circuit, characterized by: a current limiter for supplying a predetermined maximum current; and at least one FET, a gate terminal thereof coupling to the current limiter, a first source/drain terminal thereof coupling to the input to the logic sub-circuit and a second source/drain terminal thereof coupling the the corresponding input to the logic gate.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
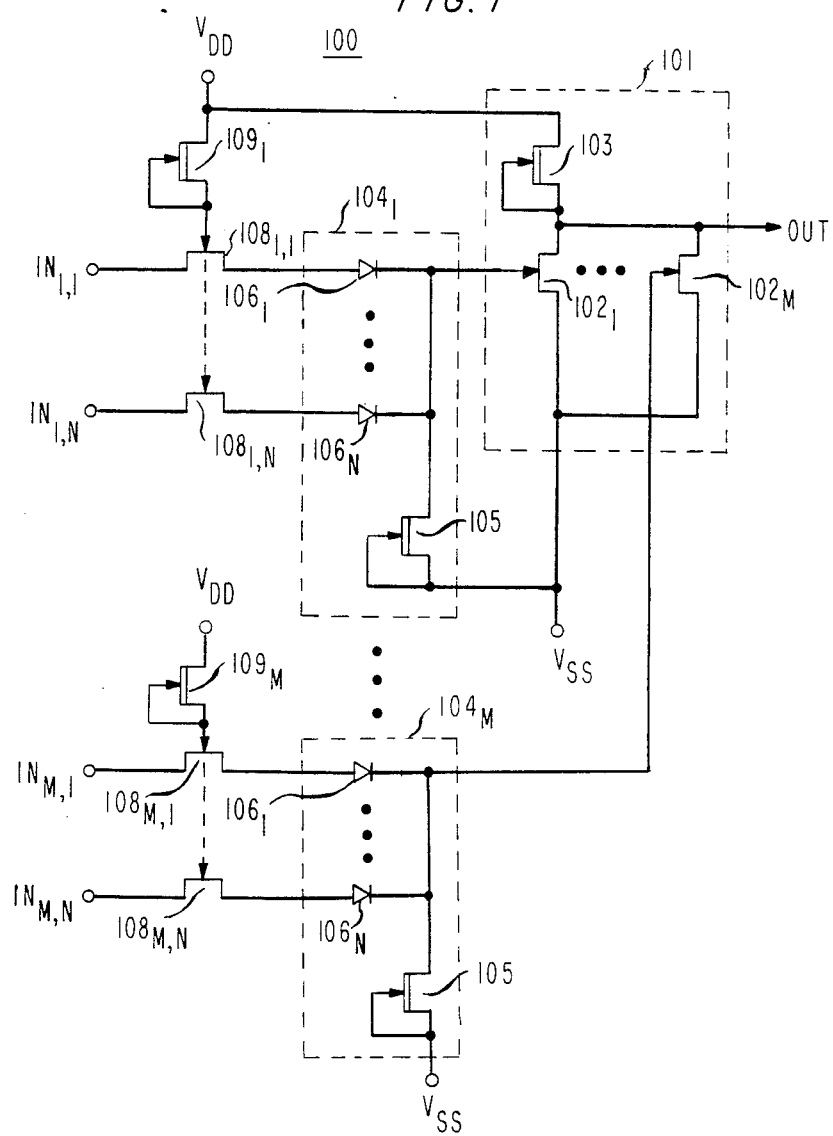
FIG. 1 is a schematic diagram of a logic gate according to one embodiment of the invention.

The logic gate 100 shown in FIG. 1 provides a complex logic function, here an "AND-OR-INVERT" function. It is also capable of operation at power supply voltages ($V_{DD}$) of 5 volts or higher without unduly high power dissipation. Further, the logic gate 100 can have a predetermined switching voltage that makes it compatible with TTL or CMOS logic families. It is understood that should any of the above logic sub-functions not be required, the unwanted function(s) can be eliminated with out adverse impact on the above advantages.

Figure 4:
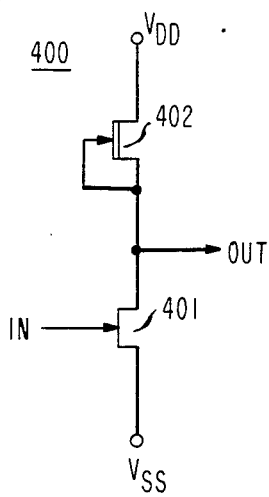
FIG. 4 is a schematic diagram of a logic circuit of the prior art.

Within the gate 100 is a logic sub-circuit 101, similar to that shown in FIG. 4, referred to above as DCFL. Sub-circuit 101 provides the "OR" and "INVERT" sub-functions of the "AND-OR-INVERT" function, above, by the parallel-connecting of FETs $102_1$–$102_M$ with FET 103 as the active load to pull up the output of the logic gate 100.

Coupling to the corresponding gate of FET $102_1$–$102_M$ is a circuit means $104_1$–$104_M$ for setting the switching voltage of the logic gate 100, each means $104_1$–$104_M$ comprising FET 105 and diodes $106_1$–$106_N$. Each diode $106_1$–$106_N$ has a predetermined voltage drop which sets the switching voltage of the logic gate 100, as will be explained in greater detail below. FET 105 discharges the gates of FETs $102_1$–$102_M$ when the diodes $106_1$–$106_N$ are turned off. Coupling to each FET $106_1$–$106_N$ in each means $104_1$–$104_M$ are first source/drain terminals of corresponding FETs $108_{1,1}$–$108_{M,N}$ which in turn have second source/drain terminals thereof coupling to the corresponding inputs, $IN_{1,1}$–$IN_{M,N}$, to the logic gate 100. The designation of first and second source/drain terminals of FETs $108_{1,1}$–$108_{M,N}$ refers to the conventional source and drain terminals thereof but, as will be demonstrated below, the function of the source and drain terminals will reverse (due to a reversal in current flow) depending on the logic input to corresponding inputs $IN_{1,1}$–$IN_{M,N}$. Corresponding FETs $108_{1,1}$–$108_{1,N}$, ..., $108_{M,1}$–$108_{M,N}$ have common gates coupling to FETs $109_1$–$109_M$ which operate as current limiters, the operation of which will be described in more detail below.

The diodes $106_1$–$106_N$ are "conventional" diodes formed by the source and gate terminals of enhancement-type or depletion-type FETs (not shown), with the predetermined voltage drop of an "enhancement-type" diode being less than that of the "depletion-type" diode for certain HFET technologies, such as the selectively doped heterojunction FET technology. It is understood that for N-channel FETs, either the source or drain terminal, or both tied together, is used as the cathode of the conventional diode while the gate is used as the anode. Further, each of the diodes $106_1$–$106_N$ can be an enhancement-type FET, as described above, additionally configured with the drain terminal coupling to the corresponding gate terminal to form the anode while the source terminal forms the cathode of the diode. This kind of "diode" for diodes $106_1$–$106_N$ has a lower voltage drop than the "enhancement-type" conventional diodes $106_1$–$106_N$ as shown, with the resulting effect on the switching voltage of the gate 100 described below.

Focusing on exemplary FETs $102_1$, $108_{1,1}$, $109_1$, and diode $106_1$, FET 105 of circuit means $104_1$, operation of logic gate 100 is explained herein. For purposes here, logical "zero" has a voltage substantially equal to $V_{SS}$ and logical "one" has a voltage of approximately $V_{DD}$. When a logical "zero" is applied to $IN_{1,1}$, current from FET $109_1$ flows through the gate of FET $108_{1,1}$ and out through the input $IN_{1,1}$, turning on FET $108_{1,1}$. Therefore, the voltage seen by diode $106_1$ from FET $108_{1,1}$ is essentially $V_{SS}$ so that no current flows through diode $106_1$ to turn on FET $102_1$, allowing a logical "one" to be on the output of the gate 100. FET 105 assures that FET $102_1$ is completely off by draining off any leakage current from diode $106_1$ and, during a transition from logical "one" to logical "zero" on input $IN_{1,1}$, quickly removes any charge left on the gate of FET $102_1$. Conversely, if a logical "one" is applied to input $IN_{1,1}$, the FET $108_{1,1}$ is on, passing current from the input $IN_{1,1}$, and from FET $109_1$ via the gate of FET $108_{1,1}$, through to diode $106_1$. The combined current then passes through diode $106_1$ to the gate terminal of FET $102_1$, turning on FET $102_1$ and forcing a logical "zero" on the output of the gate 100. It is noted that the current from the input $IN_{1,1}$ is limited by FET $108_{1,1}$, the amount of current being determined by the size of the FET $108_{1,1}$.

The current provided by FETs $109_1$–$109_M$ determines the open-input bias voltage of the sub-circuit 101. With no connections made to inputs $IN_{1,1}$–$IN_{M,N}$, i.e., the inputs are "floating", the current from FETs $109_1$–$109_M$ flows through corresponding FETs $108_{1,1}$–$108_{1,N}$, ..., $108_{M,1}$–$108_{M,N}$, through corresponding diodes $106_1$–$106_N$ and FETs 105. The resulting voltage drop across the FETs 105 is preferably the switching voltage of sub-circuit 101 to maximize the voltage gain of the logic gate 100. To get this voltage drop, the sizes of FETs $109_1$–$109_M$, 105 and diodes $106_1$–$106_N$ are suitably adjusted. It is understood that the open-input voltage to sub-circuit 101 can be other than the switching voltage thereof to achieve certain propagation delay asymmetry through the gate 100. Further, the switching voltage of the logic gate 100 can be "fine tuned" by adjusting the sizes of the FETs $109_1$–$109_M$, 105 and diodes $106_1$–$106_N$.

As stated above, the switching voltage is determined primarily by the diodes $106_1$–$106_N$. Using conventional "enhancement-type" diodes as the diodes $106_1$–$106_N$, the switching voltage is an exemplary 1.3 volts, suitable for interfacing with TTL. If a diode-coupled enhancement FETs are used (drain and gate terminals coupling together and to the first source/drain terminals of corresponding FETs $108_{1,1}$–$108_{M,N}$ as described above), the switching voltage is lower: an exemplary 1 volt. Alternatively, if conventional "depletion-type" diodes are used as diodes $106_1$–$106_N$, the switching voltage would be over 2 volts, suitable for interfacing with CMOS logic operating at 5 volts.

The "AND" logical sub-function is performed by the common gate terminals of corresponding FETs $108_{1,1}$–$108_{1,N}$, ..., $108_{M,1}$–$108_{M,N}$. For current to flow through any diode $106_1$–$106_N$, all corresponding inputs $IN_{1,1}$–$IN_{1,N}$ ... , $IN_{M,1}$, $IN_{M,N}$ must be at logical "one" so that no current from corresponding FET $109_1$–$109_M$ flows to the corresponding input $IN_{1,1}$–$IN_{1,N}$, ..., $IN_{M,1}$–$IN_{M,N}$. As stated above, the "OR" logical sub-function is performed by parallel-connected FETs $102_1$–$102_M$.

Using minimum sizes for all the FETs shown, a 13 stage ring oscillator (not shown) test circuit reveals that the logic gate 100 has an exemplary average logic delay of 90 to 100 picoseconds and a power dissipation of 1.5 milliwatts per gate 100 with a 5 volt power supply ($V_{DD}$) at room temperature.

Figure 2:
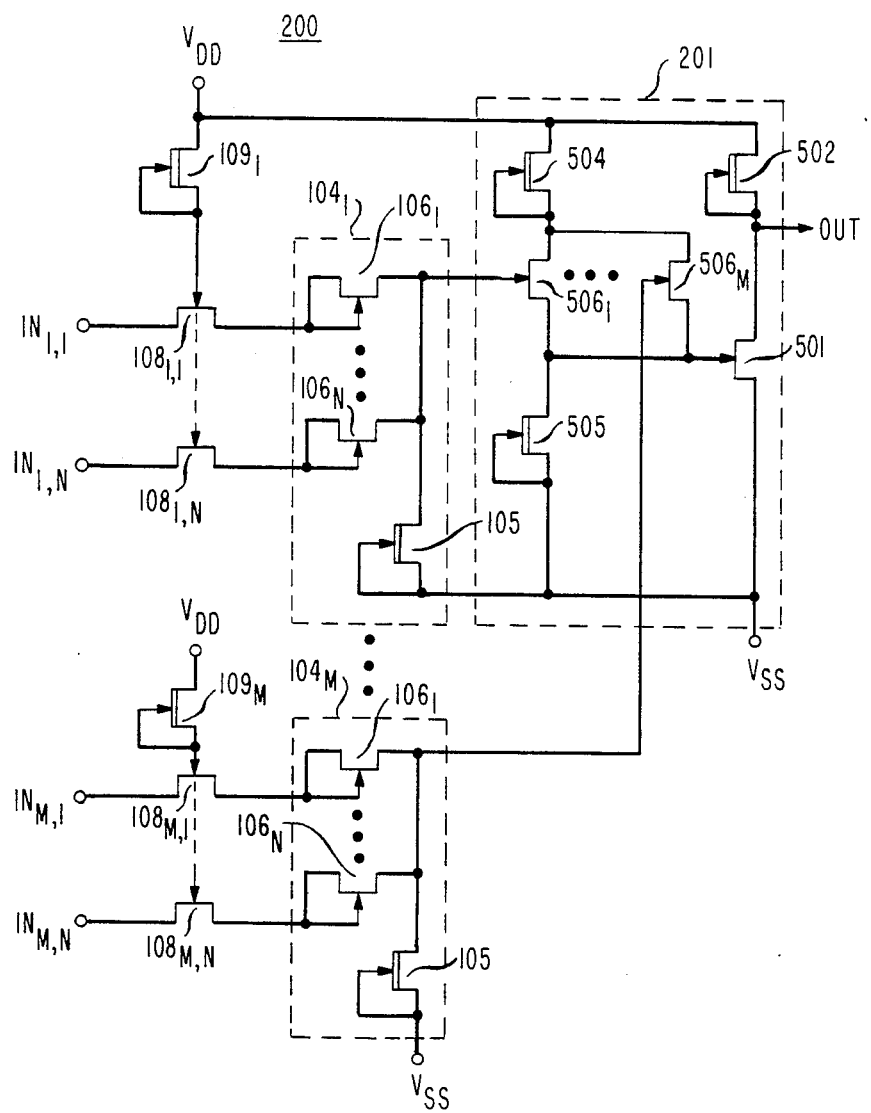
FIG. 2 is a schematic diagram of a logic gate according to another embodiment of the invention.
Figure 5:
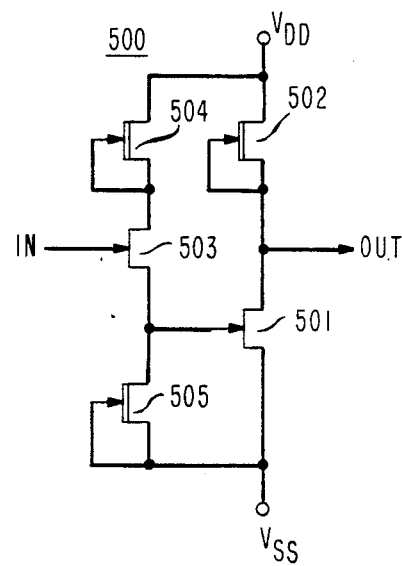
FIG. 5 is a schematic diagram of another logic circuit of the prior art.

In FIG. 2, the logic sub-circuit 101 of FIG. 1 is replaced with a logic sub-circuit 201, similar to the logic circuit 500 shown in FIG. 5, to produce another logic gate 200 which operates at relatively high voltages, e.g. 5 volts, and has TTL or CMOS logic compatibility. As stated above, the switching voltage of the logic sub-circuit 201 is approximately 1 volt, requiring that the circuit means $104_1$–$104_M$ for setting the switching voltage of the logic gate 200 will have a different effect on the switching voltage from that shown in FIG. 1. More particularly, the diodes $106_1$–$106_N$, shown here as diode-coupled enhancement FETs, set the switching voltage to be approximately 1.5 volts, suitable for interfacing with TTL. If diodes $106_1$–$106_N$ are arranged as conventional diodes (as shown in FIG. 1) and are of the enhancement-type, the switching voltage would be approximately 2 volts. Alternatively, if diodes $106_1$–$106_N$ were arranged as conventional diodes (as shown in FIG. 1) and are of the depletion-type, the switching voltage would be approximately 2.5 volts, suitable for interfacing with CMOS logic operating with a 5 volt power source. As shown, parallel-connected FETs $506_1$–$506_M$, similar to FET 503 in FIG. 5 and corresponding to FETs $102_1$–$102_M$ in FIG. 1, provide the logical "OR" subfunction for the gate 200. FETs 501, 502, 504 and 505 operate as described above relating to the logic circuit 500 in FIG. 5.

Figure 3:
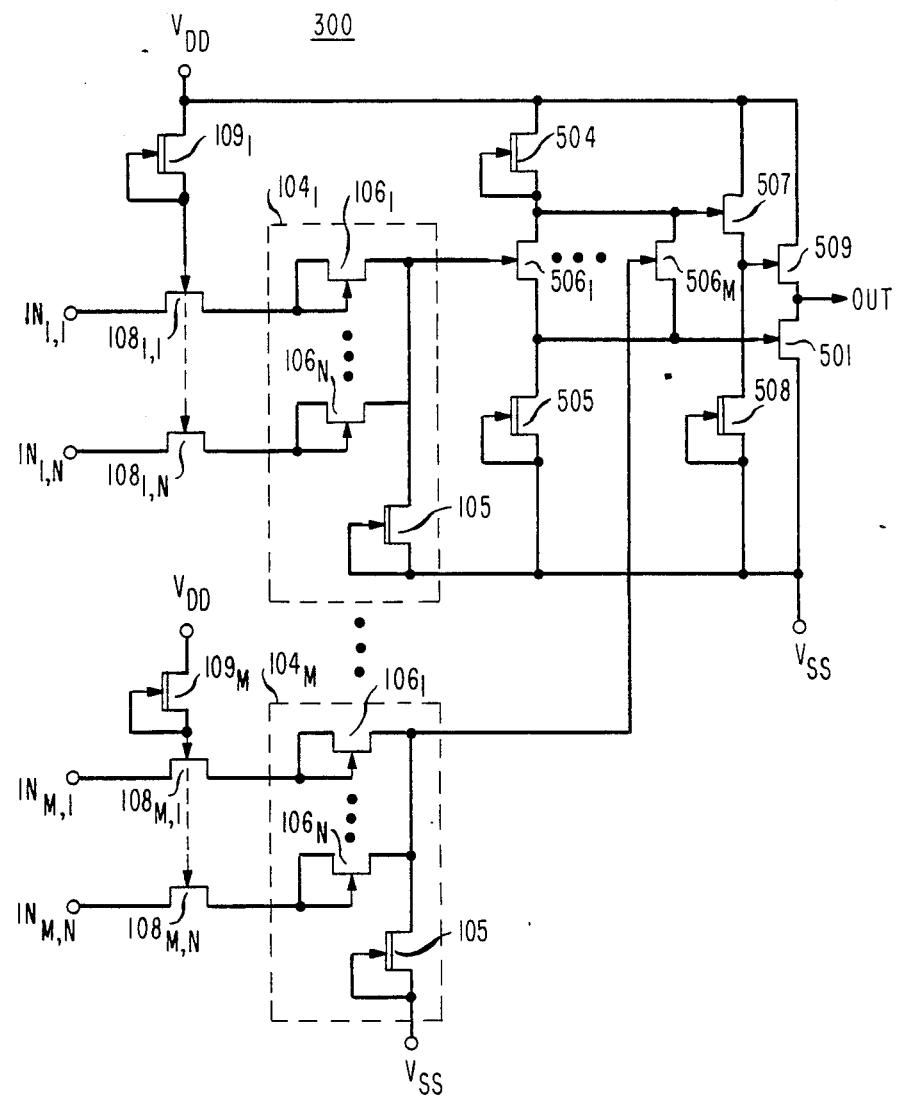
FIG. 3 is a schematic diagram of a logic gate according to still another embodiment of the invention.

In FIG. 3, an output buffer 300 is presented that allows virtually $V_{DD}$ to $V_{SS}$ output voltage swings for increasing the noise margins and provide compatibility when driving TTL or CMOS logic (not shown). It is based on the logic gate 200 (FIG. 2) but adapted to provide active pull-up of the output of the buffer 300. FETs 501, 504, 505 and $506_1$–$506_M$ operate as described above for gate 200 (FIG. 2), with FETs 504, 505, $506_1$–$506_N$ operating as a logic stage to provide the logical "AND" sub-function. FETs 507, 508 and 509 are added to the logic sub-circuit 201 of FIG. 2 to provide for active pull-up of the output of the buffer 300. With the understanding that the phase of signals coupled to the gate of FET 501 is substantially opposite that coupling to the gate of FET 507 i.e., true and inverted signals, then FET 509, with the gate terminal thereof coupling to the source of FET 507 acting as a source follower, turns on when FET 501 is off and vice versa. FET 507 also provides a voltage drop to ensure that FET 509 is completely off when FET 501 is on, reducing static current consumption and power dissipation. FET 508 serves as an active load for FET 507, quickly discharging the gate terminal of FET 509 when FET 507 turns off. Exemplary operation of the buffer 300 in a 13 stage ring oscillator (not shown) with minimum sizing of all FETs, results in an average propagation delay of approximately 90–100 picoseconds and a average power dissipation of approximately 2 milliwatts with a power supply voltage $V_{DD}$ of 5 volts at room temperature.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

What is claimed is:

1. A logic gate having at least one input and a predetermined switching voltage, disposed in an integrated circuit, and having a logic sub-circuit with at least one clamped-type input, characterized by:

a current limiter for supplying a predetermined maximum current;

at least one FET, a gate terminal thereof coupling to the current limiter, a first source/drain terminal thereof coupling to the corresponding input to the logic sub-circuit and a second source/drain terminal thereof coupling the corresponding input to the logic gate; and, at least one voltage dropping means coupled between the first source/drain terminal of the FET and the corresponding input to the logic sub-circuit, for providing a predetermined voltage drop;

wherein the voltage dropping means determines the switching voltage of the logic gate.

2. The logic gate recited in claim 1, in which the voltage dropping means is characterized by:

at least one diode means having a predetermined forward voltage drop and coupling between the first source/drain terminal of the corresponding FET and the corresponding input to the logic sub-circuit; and, a discharging means coupling to the corresponding input to the logic sub-circuit;

wherein the discharging means discharges the corresponding input to the logic sub-circuit when the diode means is not conducting current.

3. The logic gate recited in claim 2, wherein multiple FETs are parallel-connected to produce an "AND" logical function by having common gate terminals, the first source/drain terminals coupling to corresponding diode means in the voltage dropping means and the second source/drain terminals coupling to corresponding inputs to the logic gate.

4. The logic gate recited in claim 3, wherein each of the diode means is an FET.

5. The logic gate recited in claim 4, wherein the logic sub-circuit is a DCFL circuit.

6. The logic gate recited in claim 4, wherein the logic sub-circuit is a SFFL circuit.

7. A logic gate having an output, at least one input and a predetermined switching voltage, disposed in an integrated circuit, characterized by:

a logic stage having at least one input and true and inverted signal outputs;

a pull-down FET, the gate terminal thereof coupling to the true signal output of the logic stage and the drain terminal thereof coupling to the output of the logic stage, for pulling down the output of the logic gate;

a pull-up FET, the gate terminal thereof coupling to the inverted signal output of the logic stage and the source terminal thereof coupling to the output of the logic stage, for pulling up the output of the logic gate;

a current limiter for supplying a predetermined maximum current; and, at least one FET, a gate terminal thereof coupling to the current limiter, a first source/drain terminal thereof coupling to the corresponding input to the logic stage and a second source/drain terminal thereof coupling the the corresponding input to the logic gate.

8. The logic gate recited in claim 7, further characterized by:

at least one voltage dropping means coupled between the first source/drain terminal of the FET and the corresponding input to the logic stage, for providing a predetermined voltage drop;

wherein the voltage dropping means determines the switching voltage of the logic gate.

9. The logic gate recited in claim 8, in which the voltage dropping means is characterized by:

at least one diode means having a predetermined forward voltage drop and coupling between the first source/drain terminal of the corresponding FET and the corresponding input to the logic stage; and, a discharging means coupling to the corresponding input to the logic stage;

wherein the discharging means discharges the corresponding input to the logic stage when the diode means is not conducting current.

10. The logic gate recited in claim 9, wherein multiple FETs are parallel-connected to produce an "AND" logical function by having common gate terminals, the first source/drain terminals coupling to corresponding diode means in the voltage dropping means and the second source/drain terminals coupling to corresponding inputs to the logic gate.

11. The logic gate recited in claim 10, further characterized by:

a buffer, coupled between the inverted signal output of the logic stage and the gate terminal of the pull-up FET, for dropping the voltage on the inverted signal output of the logic stage by a predetermined amount.

12. The logic gate recited in claim 11, in which the buffer characterized by:

a source-follower FET having the gate terminal thereof coupling to the inverted signal output of the logic stage, the source terminal thereof couping to the gate terminal of the pull-up FET; and, a load coupling to the source terminal of the source-follower FET;

wherein the source-follower FET is an enhancement-type.

13. The logic gate recited in claim 10, wherein each of the diode means is an FET.

* * * * *